(12) United States Patent
Baek et al.

(10) Patent No.: US 10,325,856 B2
(45) Date of Patent: Jun. 18, 2019

(54) ELECTRONIC COMPONENT PACKAGE AND METHOD OF MANUFACTURING THE SAME

(71) Applicant: SAMSUNG ELECTRO-MECHANICS CO., LTD., Suwon-si, Gyeonggi-do (KR)

(72) Inventors: Yong Ho Baek, Suwon-si (KR); Sang Kun Kim, Suwon-si (KR); Ye Jeong Kim, Suwon-si (KR); Jae Ean Lee, Suwon-si (KR); Jae Hoon Choi, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/385,414

(22) Filed: Dec. 20, 2016

(65) Prior Publication Data
US 2017/0213794 A1 Jul. 27, 2017

(30) Foreign Application Priority Data
Jan. 22, 2016 (KR) ........................ 10-2016-0008249

(51) Int. Cl.
*H05K 1/18* (2006.01)
*H01L 21/48* (2006.01)
(Continued)

(52) U.S. Cl.
CPC ........ *H01L 23/5389* (2013.01); *H01L 21/486* (2013.01); *H01L 21/4857* (2013.01);
(Continued)

(58) Field of Classification Search
CPC ............. H01L 23/3128; H01L 23/5389; H01L 23/5386; H01L 2924/01079;
(Continued)

(56) References Cited

U.S. PATENT DOCUMENTS

| 8,461,689 B2 * | 6/2013 | Chia | ................... | H01L 23/5389 |
| | | | | 257/685 |
| 2009/0127686 A1 * | 5/2009 | Yang | ...................... | H01L 24/82 |
| | | | | 257/686 |

(Continued)

FOREIGN PATENT DOCUMENTS

KR 10-1332916 B1 11/2013
KR 10-2015-0084287 A 7/2015

OTHER PUBLICATIONS

Non-Final Office Action issued in related U.S. Appl. No. 15/982,839, dated Jul. 13, 2018.

*Primary Examiner* — Jasmine J Clark
(74) *Attorney, Agent, or Firm* — Morgan, Lewis & Bockius LLP

(57) ABSTRACT

An electronic component package includes first and second wiring parts including insulating layers, conductive patterns formed in the insulating layers, and conductive vias penetrating through the insulating layers, to be connected to the conductive patterns, respectively; a frame disposed between the first and second wiring parts and having conductive connection parts electrically connecting one or more through-holes with the first and second wiring parts and an electronic component disposed to be surrounded by the through-hole, to thereby be connected to the first wiring part, wherein the conductive patterns formed to be adjacent to the electronic component among the conductive patterns of the first wiring part are embedded in the insulating layer of the first wiring part.

15 Claims, 10 Drawing Sheets

(51) Int. Cl.
*H01L 21/56* (2006.01)
*H01L 21/66* (2006.01)
*H01L 23/00* (2006.01)
*H01L 23/13* (2006.01)
*H01L 23/31* (2006.01)
*H01L 23/538* (2006.01)

(52) U.S. Cl.
CPC .............. *H01L 21/56* (2013.01); *H01L 22/14* (2013.01); *H01L 23/3114* (2013.01); *H01L 23/3128* (2013.01); *H01L 23/5383* (2013.01); *H01L 23/5384* (2013.01); *H01L 23/5385* (2013.01); *H01L 23/5386* (2013.01); *H01L 24/24* (2013.01); *H01L 24/82* (2013.01); *H05K 1/186* (2013.01); *H01L 23/13* (2013.01); *H01L 2224/215* (2013.01); *H01L 2224/24265* (2013.01); *H01L 2224/82005* (2013.01); *H01L 2924/0105* (2013.01); *H01L 2924/01013* (2013.01); *H01L 2924/01028* (2013.01); *H01L 2924/01029* (2013.01); *H01L 2924/01047* (2013.01); *H01L 2924/01079* (2013.01); *H01L 2924/01082* (2013.01); *H01L 2924/15153* (2013.01); *H01L 2924/15192* (2013.01); *H01L 2924/15311* (2013.01); *H01L 2924/19102* (2013.01)

(58) Field of Classification Search
CPC ....... H01L 23/5383; H01L 2924/19102; H01L 2924/01028; H01L 2924/0105; H01L 2924/1531; H01L 2924/15311; H01L 2924/24265; H01L 23/3114; H01L 23/5384; H01L 22/14; H01L 22/82; H01L 24/24; H01L 23/5385; H01L 23/49827; H01L 24/82; H01L 23/49822; H01L 23/13; H01L 2924/15192; H01L 2924/01013; H01L 2924/01029; H01L 2924/15153
USPC .......................................................... 257/774
See application file for complete search history.

(56) References Cited

U.S. PATENT DOCUMENTS

| | | | |
|---|---|---|---|
| 2010/0140771 A1* | 6/2010 | Huang | H01L 23/49833 257/686 |
| 2013/0026632 A1* | 1/2013 | Kikuchi | H01L 21/6835 257/753 |
| 2013/0285254 A1* | 10/2013 | Kainuma | H01L 24/18 257/774 |
| 2014/0063768 A1 | 3/2014 | Tanaka et al. | |
| 2014/0070396 A1* | 3/2014 | Kyozuka | H01L 24/19 257/698 |
| 2014/0353823 A1 | 12/2014 | Park et al. | |
| 2016/0020175 A1* | 1/2016 | Kuo | H01L 25/065 257/783 |
| 2017/0033062 A1* | 2/2017 | Liu | H01L 23/66 |
| 2017/0236788 A1* | 8/2017 | Lin | H01L 23/562 |
| 2018/0131094 A1* | 5/2018 | Ho | H01Q 21/28 |

* cited by examiner

ELECTRONIC COMPONENT PACKAGE AND METHOD OF MANUFACTURING THE SAME

CROSS-REFERENCE TO RELATED APPLICATION(S)

This application claims the benefit of priority to Korean Patent Application No. 10-2016-0008249, filed on Jan. 22, 2016 in the Korean Intellectual Property Office, the entire disclosure of which is incorporated herein by reference.

BACKGROUND

1. Technical Field

The present disclosure relates to an electronic component package and a method of manufacturing the same.

2. Description of Related Art

An electronic component package serves to protect electronic components from external shocks while electrically connecting the electronic components to a printed circuit board (PCB), for example, a main board of an electronic device. One of the recent trends in the development of technology related to electronic components has been to reduce the size of the components. In addition to this trend toward increased demand for smaller electronic components, there has also been increased demand for the implementation of a plurality of pins in components having a small size in the technical field of electronic component packaging.

In order to satisfy the technical demand as described above, a wafer level package (WLP) may be implemented, which uses the rewiring of the electrode pad of an electronic component formed on a wafer. Examples of wafer level packages include fan-in wafer level packages and fan-out wafer level packages. In particular, since fan-out wafer level packages are useful in terms of implementing a plurality of pins while maintaining a small size, fan-out wafer level packages have recently been actively developed.

When such a package is manufactured, an electrical test for detecting whether or not the package is faulty is required. Conventionally, the electrical test is performed after the electronic component is mounted on a board, such as an integrated circuit (IC) chip. As such, in the case in which the electrical test is performed on an already-mounted electronic component, when a fault occurs, the electronic component, in addition to the wiring layer forming the package, is no longer usable, leading to significantly large losses for manufacturers.

SUMMARY

An aspect of the present disclosure provides an electronic component package having a compact structure while including a plurality of electronic components, having significantly improved manufacturing efficiency through electrical tests being performed on wiring parts before the electronic components are mounted.

Another aspect of the present disclosure provides a manufacturing method allowing the electronic component package described above to be efficiently manufactured.

According to an aspect of the present disclosure, an electronic component package includes: first and second wiring parts including an insulating layer, a conductive pattern formed in the insulating layer, and a conductive via penetrating through the insulating layer to be connected to the conductive pattern, respectively; a frame disposed between the first and second wiring parts and having conductive connection parts electrically connecting one or more through-holes with the first and second wiring parts; and an electronic component disposed to be surrounded by the through-hole to thereby be connected to the first wiring part, wherein the conductive patterns formed to be adjacent to the electronic component among the conductive patterns of the first wiring part may be embedded in the insulating layer of the first wiring part.

BRIEF DESCRIPTION OF THE DRAWINGS

The above and other aspects, features and other advantages of the present disclosure will be more clearly understood from the following detailed description when taken in conjunction with the accompanying drawings, in which.

DETAILED DESCRIPTION

Hereinafter, exemplary embodiments in the present disclosure will be described in detail with reference to the accompanying drawings.

Electronic Device

Figure 1:
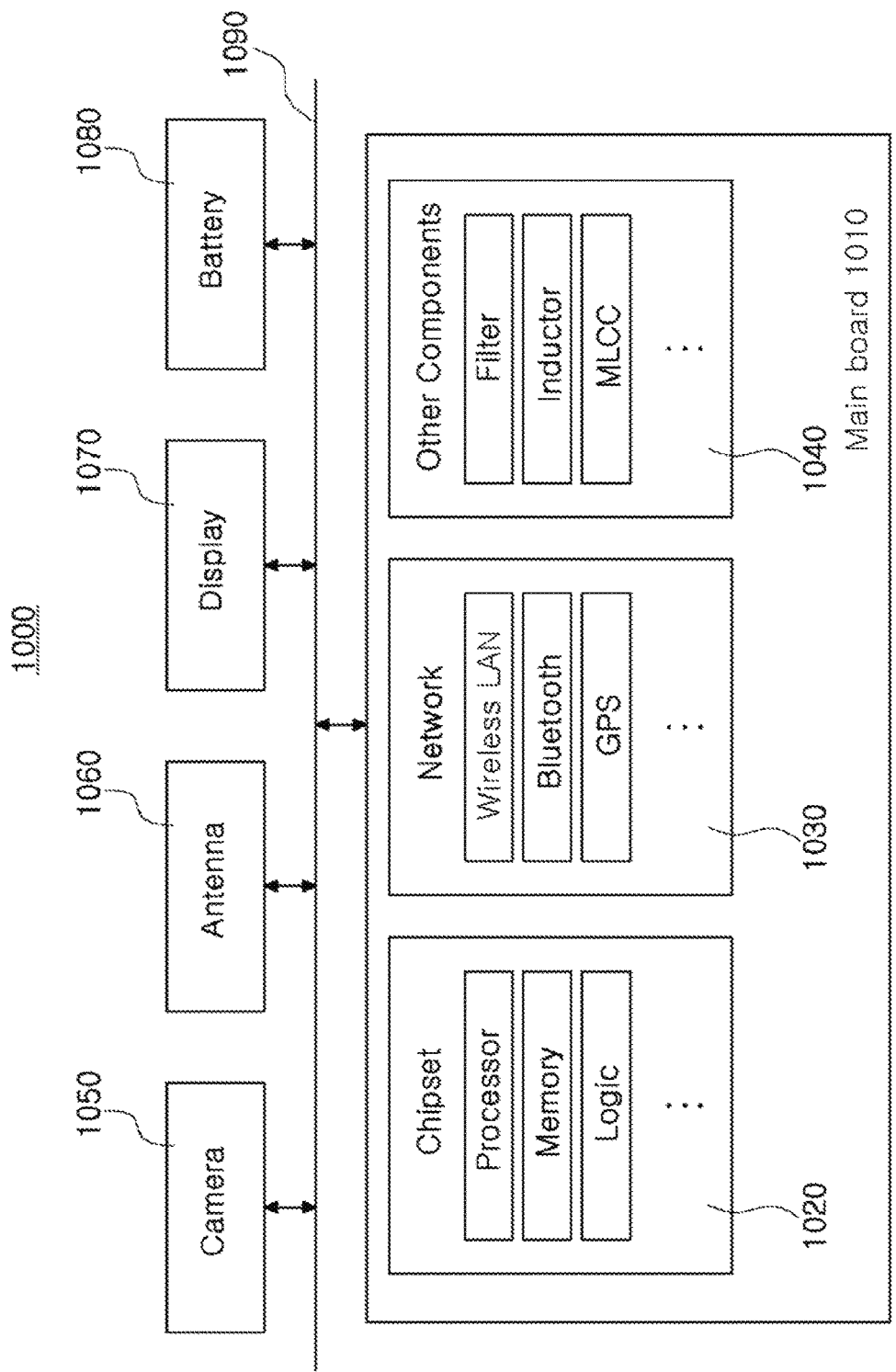
FIG. 1 is a block diagram schematically illustrating an exemplary embodiment of an electronic device system.

FIG. 1 is a block diagram schematically illustrating an example of an electronic device system. Referring to FIG. 1, an electronic device 1000 may accommodate a main board 1010. The main board 1010 may be physically and/or electrically connected to chip-related components 1020, network-related components 1030, and other components 1040. These components may be coupled to other components, to be described below, to form various signal lines 1090.

The chip-related components 1020 may include a memory chip such as a volatile memory (e.g., a dynamic random access memory (DRAM)), a non-volatile memory (e.g., a read only memory (ROM)), a flash memory, or the like; an application processor chip, such as a central processor (e.g., a central processing unit (CPU)), a graphics processor (e.g., a graphics processing unit (GPU)), a digital signal processor, a cryptographic processor, a micro processor, a micro controller, or the like; a logic chip, such as an analog-to-digital (ADC) converter, and an application-specific integrated circuit (ASIC), or the like. However, the chip-related components 1020 are not limited thereto, but may also include other types of chip-related components. In addition, these chip-related components 1020 may be combined with each other.

The network-related components 1030 may include wireless fidelity (Wi-Fi) (Institute of Electrical and Electronics Engineers (IEEE) 802.11 family, or the like), Worldwide Interoperability for Microwave Access (WiMAX) (IEEE 802.16 family, or the like), IEEE 802.20, Long Term Evolution (LTE), Evolution Data Only (Ev-DO), High Speed Packet Access+ (HSPA+), High Speed Downlink Packet Access+ (HSDPA+), High Speed Uplink Packet Access+ (HSUPA+), Enhanced Data GSM Environment (EDGE), Global System for Mobile Communications (GSM), Global Positioning System (GPS), General Packet Radio Service (GPRS), Code Division Multiple Access (CDMA), Time Division Multiple Access (TDMA), Digital Cordless Telephone (DECT), Bluetooth, 3G, 4G, 5G protocols and any other wired and wireless protocols designated as those following the above-mentioned protocols. However, the network-related components 1030 are not limited thereto, but may also include any of a plurality of other wireless or wired standards or protocols. In addition, these network-related components 1030 may be combined with each other or with the chip-related components 1020 described above.

Other components 1040 may include a high frequency inductor, a ferrite inductor, a power inductor, ferrite beads, low temperature co-fired ceramics (LTCC), an electromagnetic interference (EMI) filter, a multilayer ceramic capacitor (MLCC), and the like. However, other components 1040 are not limited thereto, but may also include passive components used for various other purposes and the like. In addition, these other components 1040 may be combined with each other or with the chip-related components 1020 and/or the network-related components 1030 described above.

Depending on a kind of the electronic device 1000, the electronic device 1000 may include other components, which may be physically and/or electrically connected to the main board 1010 or not. Such other components may include, for example, a camera 1050, an antenna 1060, a display 1070, a battery 1080, an audio codec (not shown), a video codec (not shown), a power amplifier (not shown), a compass (not shown), an accelerometer (not shown), a gyroscope (not shown), a speaker (not shown), a mass storage device (e.g., a hard disk drive) (not shown), a compact disk (CD) drive (not shown), and a digital versatile disk (DVD) drive (not shown). However, such other components are not limited thereto, but may also include other components used for various purposes, depending on the kind of the electronic device 1000.

The electronic device (1000) may be a smartphone, a personal digital assistant, a digital video camera, a digital still camera, a network system, a computer, a monitor, a tablet, a laptop, a netbook, a television, a video games console, a smartwatch, and the like. However, the electronic device 1000 is not limited thereto, and may be any other electronic device for processing data, in addition to those mentioned above.

Figure 2:
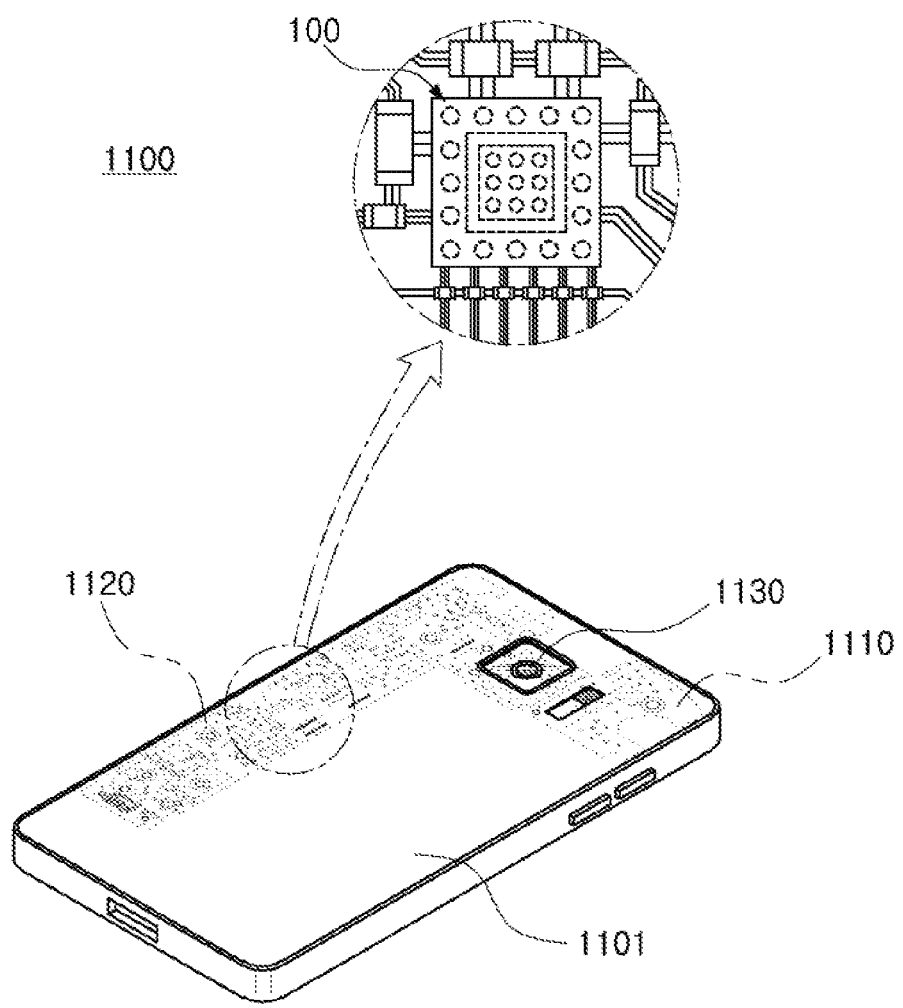
FIG. 2 schematically illustrates an exemplary embodiment of an electronic component package applied to an electronic device.

FIG. 2 schematically illustrates an example of an electronic component package applied to an electronic device. The electronic component package may be applied to various electronic devices 1000 as described above for various purposes. For example, the main board 1110 may be accommodated within a body 1101 of the smartphone 1100, and various electronic components 1120 may be physically and/or electrically connected to the main board 1110. In addition, other components which may be physically and/or electrically connected to the main board 1010, or not, such as the camera 1130, may be accommodated within the body 1101. In this case, some of the electronic components 1120 may be the chip-related components 1020 as described above, and the electronic component package 100 may be, for example, the application processor among the chip related components, but is not limited thereto.

Electronic Component Package and Manufacturing Method of the Same

Figure 3:
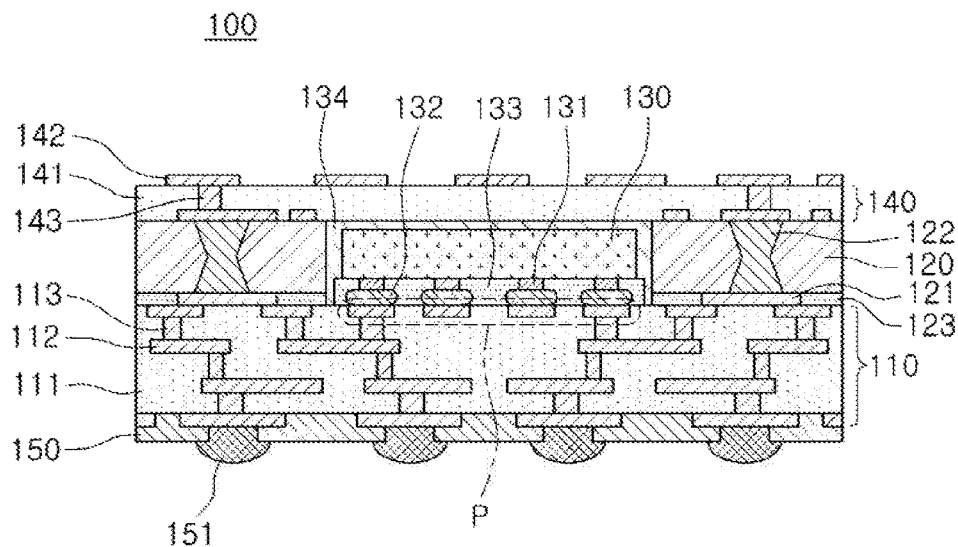
FIG. 3 is a cross-sectional view schematically illustrating an exemplary embodiment of the electronic component package.

FIG. 3 is a cross-sectional view schematically illustrating the electronic component package according to an exemplary embodiment. The electronic component package 100, according to the present exemplary embodiment, may include a first wiring part 110, a frame 120, an electronic component 130, and a second wiring part 140, as main components.

The first wiring part 110 may be provided as amounting region of the electronic component 130, and may be electrically connected to the electronic component 130. The first wiring part 110 may include an insulating layer 111, a conductive pattern 112, and a conductive via 113, and may perform a function of rewiring a wiring structure of the electronic component 130. Although FIG. 3 illustrates an example in which the first wiring part 110 has a multilayer structure, the first wiring part 110 may also be formed in a single layer. In addition, the first wiring part 110 may also have more layers, according to a design specification.

Insulating materials which may be used in the insulating layer 111 include a thermosetting resin such as an epoxy resin, a thermoplastic resin such as polyimide, a resin having a reinforcement material such as a glass fiber or an inorganic filler impregnated therein, for example, a prepreg, Ajinomoto Build-up Film (ABF), FR-4, a bismaleimide triazine (BT) resin, or the like. In addition, in a case in which a photo curable material (PID) is used as the insulating material, the insulating layer 111 may be formed to be thinner, and a fine pattern may be more easily implemented. The insulating layer 111 forming each of the layers in the first wiring part 110 may be formed of the same material, or it may also be formed of different materials. A thickness of the insulating layer 111 is not particularly limited, and for example, each of the layers may have a thickness of about 5 μm to 20 μm when a thickness of the conductive pattern 112 is excluded, and about 15 μm to 70 μm when the thickness of the conductive pattern 112 is considered.

The conductive pattern 112 may serve as a wiring pattern and/or a pad pattern, and may be formed of a conductive material such as copper (Cu), aluminum (Al), silver (Ag), tin (Sn), gold (Au), nickel (Ni), lead (Pb), or alloys thereof. The conductive pattern 112 may perform various functions depending on a design of the corresponding layer. For example, the conductive pattern 112 may serve as a ground pattern, a power pattern, a signal pattern, or the like, or as a rewiring pattern. Here, the signal pattern may transmit and receive a variety of signals, excluding signals for the ground pattern, the power pattern, and the like, for example, a data signal, or the like. In addition, the conductive pattern 112 may serve as a via pad, an external connection terminal pad, a pad pattern, or the like. A thickness of the conductive pattern 112 is also not particularly limited, and may be, for example, about 10 μm to 50 μm.

According to the present exemplary embodiment, conductive patterns P, formed to be adjacent to the electronic component 130 among the conductive patterns 112 of the first wiring part 110, may be provided by being embedded in the insulating layer 111. In this case, the conductive patterns P adjacent to the electronic component 130 may be the conductive patterns which are directly connected to the electronic component 130. In addition to this, the conductive patterns 112 may also include additional conductive patterns 112. These conductive patterns 112 are at the same level as the conductive patterns P, which are directly connected to the electronic component 130, and are directly connected to the frame 120. Since the above-mentioned embedded patterns P have a lower possibility of short-circuits being generated than other adjacent patterns, compared to a pattern having a protruding shape, they may be formed at a relatively narrow interval. That is, the conductive patterns P adjacent to the electronic component 130 among the conductive patterns 112 may be implemented to have a smaller pitch than those which are not adjacent to the electronic component 130. As such, a fine pattern may be implemented by the embedded patterns P adjacent to the electronic component 130, whereby advantages such as an improvement of mounting density of the electronic component 130, slimness of the package, and the like may be provided.

Furthermore, a surface treatment layer may be formed on the conductive patterns of the insulating layer 111 among the conductive patterns 112 that are exposed externally, for example, among the conductive patterns connected to the electronic component 130. The surface treatment layer is not particularly limited, as long as it is known in the art, and may be formed by, for example, electrolytic gold plating, electroless gold plating, OSP or electroless tin plating, electroless silver plating, electroless nickel plating/displacement gold plating, direct immersion gold (DIG) plating, hot air solder leveling (HASL), and the like.

The conductive via 113 may electrically connect the conductive patterns 112 to each other, even if they are formed on different layers, and, consequently, may form an electrical path within the package 100. The conductive via 113 may also be formed of a conductive material such as copper (Cu), aluminum (Al), silver (Ag), tin (Sn), gold (Au), nickel (Ni), lead (Pb), or alloys thereof. The conductive via 113 may be fully filled with a conductive material or the conductive material may be formed along a wall of the via. In addition, regarding the shape of the conductive via 113, any shape commonly known in the art may be used, such as a taper shape, in which a diameter is decreased toward a lower surface of the via, an inverse taper shape in which the diameter is increased toward the lower surface of the via, a cylindrical shape, and the like.

The frame 120, which serves to support the package 100, may maintain hardness and secure uniformity of thickness. The frame 120 may include one or more through-holes, and the electronic component 130 may be positioned within the through-holes. A material forming the frame 120 is not particularly limited, a molding resin or a prepreg, possibly a metal, or a ceramic-based material may be used. For example, as described below, the frame 120 may be bonded to the first wiring part 110 after a hole is machined in the prepreg. To this end, an adhesive layer 123 may be interposed between the frame 120 and the first wiring part 110. In this case, the adhesive layer 123 may be formed of a material including a prepreg, a solder resist, and the like.

According to the present exemplary embodiment, a conductive connection part 122, penetrating through the frame 120 to be connected to the first and second wiring parts 110 and 140, may be formed in the frame 120. As an example, as illustrated in FIG. 3, the conductive connection part 122 of the frame 120 may be provided to be connected to the conductive pattern 112 of the first wiring part 110 and to conductive patterns 121 formed on an upper portion and a lower portion of the frame 120. The conductive connection part 122 may be implemented using a process such as plating or the like to fill the hole after machining the hole in the frame 120, or may be implemented in a form of a conductive post. With regard to a shape of the conductive connection part 122, as illustrated in FIG. 3, the conductive connection part 122 may have a shape in which a width is decreased from upper and lower surfaces of the frame 120 to an inside of the frame 120. The above-mentioned shape of the conductive connection part 122 may be achieved by machining the hole in the upper portion and the lower portion of the frame 120, respectively, and may be suitable for a method for bonding the frame 120 to the first wiring part 110, as described below with reference to a manufacturing process.

The electronic component 130 may include various active components (e.g., a diode, a vacuum tube, a transistor, etc.) or passive components (e.g., an inductor, a condenser, a resistor, etc.). Alternatively, the electronic component 130 may be an integrated circuit (IC) chip in which hundreds to millions or more elements are integrated in one chip. In addition, the IC chip may also be an electronic component which is packaged in flip chip form. The IC chip may be, for example, an application processor chip, such as a central processor (e.g., a central processing unit (CPU)), a graphics processor (e.g., a graphics processing unit (GPU)), a digital signal processor, a cryptographic processor, a micro processor, a micro controller, or the like, but is not limited thereto. In this case, although FIG. 3 illustrates a form in which just one electronic component 130 is mounted on the first wiring part 110, two or more electronic components may also be used.

The electronic component 130 may include one or more electrode pads 131 which are electrically connected to the first wiring part 110, and, as in the exemplary embodiment illustrated in FIG. 3, the electronic component 130 may be mounted in a manner such that the electrode pads included in the electronic component 130 are connected to the first wiring part 110. The electronic component 130 may be rewired by the first wiring part 110. To this end, the conductive patterns 112 of the first wiring part 110 and adhesive and electrical connection parts 132, such as a solder or the like, may be interposed between the electronic component 130 and the first wiring part 110. In addition, in order to mount the electronic component 130 stably, an adhesive part 133, formed of an underfill resin or an insulating epoxy, may be interposed between the electronic component 130 and the first wiring part 110. However, the adhesive part 133 may be appropriately modified or excluded according to exemplary embodiments. A thickness of a cross section of the electronic component 130 is not particularly limited, and may be varied, depending on a kind of electronic component 130. For example, in a case in which the electronic component is the IC chip, the thickness in the cross section thereof may be about 100 μm to 480 μm, but is not limited thereto.

An encapsulant 134, which may serve to protect the electronic component 130 and the like, may be filled in the through-holes of the frame 120. A material forming the encapsulant 134 is not particularly limited as long as it serves to protect the electronic component. For example, as the encapsulant 134, a thermosetting resin such as an epoxy resin, a thermoplastic resin such as polyimide, or a resin having a reinforcement material such as a glass fiber or an inorganic filler impregnated therein, for example, a prepreg, ABF, FR-4, BT, a PID resin, or the like may be used. In addition, the encapsulant 134 may be obtained by stacking a resin film in an uncured state on the first wiring part 110 and then curing the stacked resin film, or, in addition to this method, a known molding method such as EMC or the like may also be used.

In order to block electromagnetic waves, the encapsulant 134 may further include conductive particles. Any conductive particles may be used as long as they are able to block the electromagnetic waves. For example, the conductive particles may be formed of copper (Cu), aluminum (Al), silver (Ag), tin (Sn), gold (Au), nickel (Ni), lead (Pb), a solder, or the like, but these are merely examples and the particles' composition is not limited thereto.

The second wiring part 140 may be disposed on the electronic component 130 and the frame 120, and an additional electronic component or package may be disposed on the second wiring part 140. Similar to the first wiring part 110, the second wiring part 140 may include an insulating layer 141, a conductive pattern 142, and a conductive via 143. The second wiring part 140 may electrically connect the electronic component, the package, other elements and the like, to each other, and may also serve to rewire an electrical wire of a component disposed on an upper portion thereof, in some cases. In this case, the second wiring part 140 may be formed to be thinner than the first wiring part 110. For example, as illustrated in FIG. 3, the first wiring part 110 may contain a larger number of insulating layers 111 than are contained in the second wiring part 140. However, this is an example and the present disclosure is not limited thereto.

An external layer 150, which may protect the first wiring part 110 and the second wiring part 140 from external physical and chemical impacts, may be formed on the lower portion of the first wiring part 110 and on an upper portion of the second wiring part 140, although not shown. In this case, the external layer 150 may have an opening exposing at least a portion of the conductive patterns 112 and 142. A material forming the external layer 150 is not particularly limited, and, for example, a solder resist may be used. In addition, the external layer 150 may be formed of the same material as the insulating layers of the first and second wiring parts 110 and 140. Further, the external layer 150 may be a single layer, or it may also be formed in multiple layers.

A connection terminal 151 may be formed below the electronic component package 100. The connection terminal 151 may be a configuration for physically and/or electrically connecting the electronic component package 100 to the outside. For example, the electronic component package 100 may be mounted on the main board of the electronic device through the connection terminal 151. The connection terminal 151 may be connected to the conductive pattern 112 through the opening formed in the external layer 150, and, as a result, may be electrically connected to the electronic component 130. The connection terminal 151 may be formed of a conductive material, for example, copper (Cu), aluminum (Al), silver (Ag), tin (Sn), gold (Au), nickel (Ni), lead (Pb), a solder, or the like, but this is merely an example and the material of the connection material 151 is not particularly limited thereto. The connection terminal 151 may be a land, a ball, a pin, or the like. The connection terminal 151 may be formed in multiple layers or a single layer. In the case in which the connection terminal 151 is formed in multiple layers, the connection terminal 151 may include copper (Cu) filler and a solder, and in the case in which the connection terminal 151 is formed in a single layer, the connection terminal 151 may include a tin-silver solder or copper (Cu). However, these are merely examples, and the material included in the connection terminal 151 is not limited thereto.

A portion of the external connection terminal 151 may be disposed on a fan-out region. The fan-out region is a region outside of a region in which the electronic component is disposed. That is, the electronic component package 100, according to an exemplary embodiment, may be a fan-out package. The fan-out package may have excellent reliability, may implement a plurality of I/O terminals, and may easily perform a 3D interconnection, compared to a fan-in package. In addition, compared to a ball grid array (BGA) package, a land grid array (LGA) package, and the like, since the fan-out package may be mounted on the electronic device without using a separate substrate, the package may be manufactured to have a thin thickness, and price competitiveness may be excellent.

The electronic component package 100 described above may implement a plurality of electronic components in a single package having a compact size, and may also be a structure suitable for performing a partial electrical test before mounting the electronic components. Accordingly, unnecessary consumption of the electronic component 130, which is relatively expensive among components of the package, may be reduced. That is, in a case in which the electrical test is performed after mounting the electronic components 130, there may be a problem in which the electronic components are not able to be used, even though the fault occurred in the wiring parts rather than in the electronic components. Hereinafter, a manufacturing method of an electronic component package having the structure described above will be described. A package structure according to the exemplary embodiments or the modified example described above may be more clearly understood by a description of the manufacturing method.

FIGS. 4 through 8 schematically illustrate a manufacturing method of an electronic component package according to an exemplary embodiment in the present disclosure.

Figure 4:
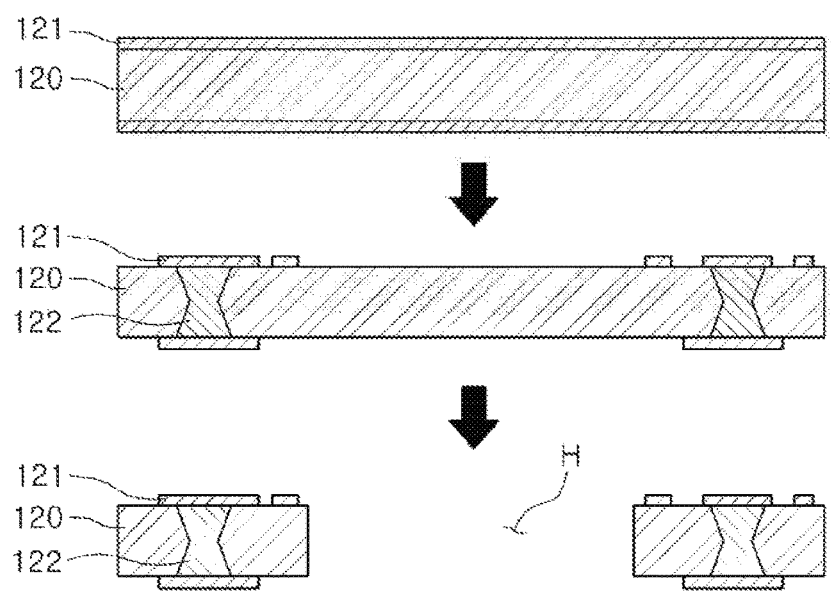
FIGS. 4 through 8 schematically illustrate a manufacturing method of an electronic component package according to an exemplary embodiment in the present disclosure.

First, as illustrated in FIG. 4, the frame 120, having the through-hole H, may be prepared. To this end, a copper clad laminate (CCL) or the like may be used. More specifically, a process of forming a conductive connection part 122 by machining the hole in the frame 120 and filling the hole with the conductive material, a process of forming the conductive pattern 121 by patterning a metal thin film, a process of forming the through-hole H in the frame 120, and the like may be executed. Here, in the case of the process of machining the hole in the frame 120, a laser or mechanical machining method may be used for the upper and lower portions of the frame 120, respectively. Similarly, the through-hole H, provided as a region accommodating the electronic component, may be formed by performing laser or mechanical machining on the frame 120.

Figure 5:
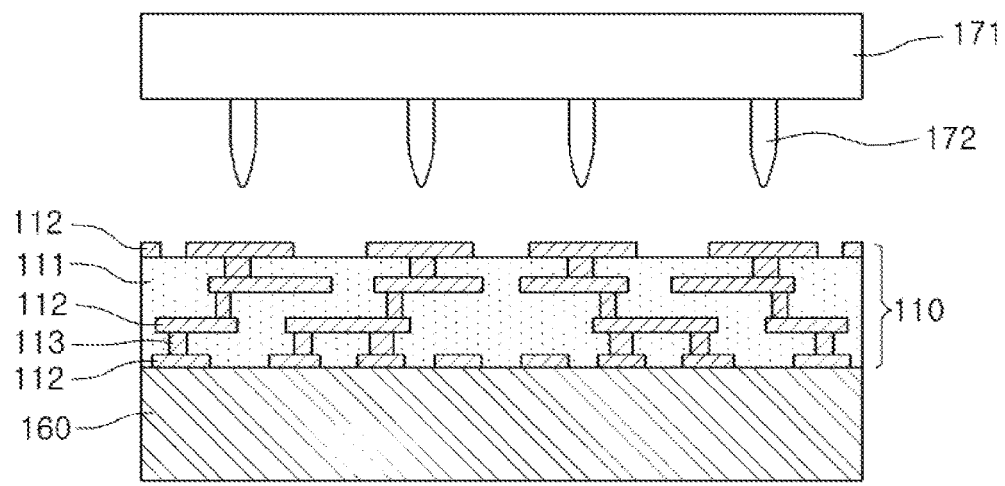

Independent from or at the same time as the processes of FIG. 4, the first wiring part 110 may be formed on a first support 160, as illustrated in FIG. 5. The purpose of the first support 160 is to provide a support for the first wiring part 110 having a relative thin thickness, and a material which may be used in the first support 160 is not particularly limited, as long as it serves to support the first wiring part 110. The first support 160 may be a multilayer structure, and may include a release layer, a metal layer, or the like, so as to be easily removed together with the first wiring part 110 in the subsequent process. According to the present exemplary embodiment, an electrical test for the first wiring part 110 may be performed in a state in which the first support 160 is coupled to the first wiring part 110. Specifically, as illustrated in FIG. 5, a test jig 171 may be connected to the conductive pattern 112 over the first wiring part 110. In this case, the test jig 171 may include a plurality of tips 172, and the plurality of tips 172 may be disposed at positions corresponding to at least some of the conductive patterns 112. Since whether or not the first wiring part 110 is faulty may be identified in advance by performing the electrical test before mounting the electronic component, unnecessary consumption of the electronic component may be significantly reduced. That is, the first wiring part 110 which is judged as faulty in the present test process may be discarded or reused for other purposes, and the subsequent process does not need to be performed, thereby reducing process costs. The first wiring part 110 may include an additional structure such as a daisy chain for the electrical test. Accordingly, the electrical test may be performed through the upper portion of the first wiring part 110, even in a state in which the first support 160 is bonded to the lower portion of the first wiring part 110.

In order to implement the first wiring part 110, the insulating layer 111, the conductive pattern 112, and the conductive via 113 may be formed to be matched to an intended shape, which may be repeated as many times as necessary. Specifically, the insulating layer 111 may be formed by a known method, and may be formed by, for example, a method of lamination and then curing, or an application and curing method, and the like. As the lamination method, for example, a method of separating a working tool by cooling the insulating layer in a cold press, after a hot press, in which the insulating layer is compressed for a predetermined time at a high temperature and is then decompressed to be cooled to a room temperature, may be used. As the application method, for example, a screen printing method in which ink is applied by squeezing it onto a surface, a spray printing method in which the ink is misted and applied, and the like may be used. The curing may refer to drying the insulating layer so as not to be fully cured in order to then use a photolithography method, or the like, as a post-process.

Figure 6:
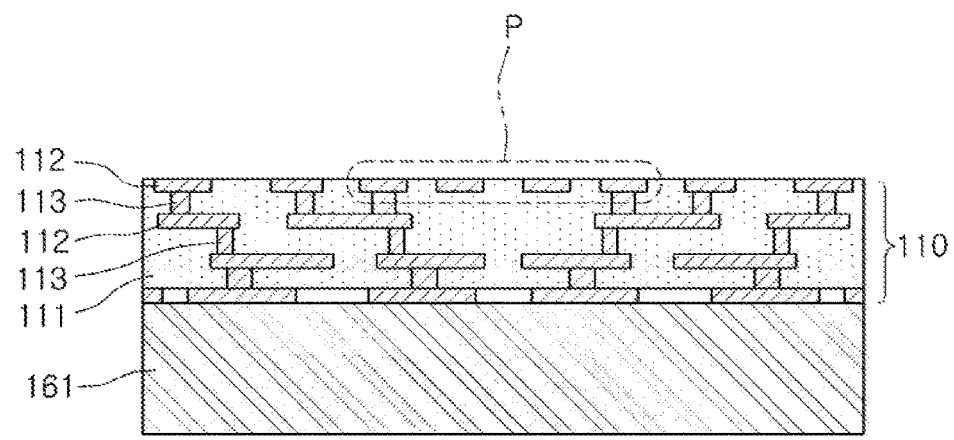

Next, as illustrated in FIG. 6, the first wiring part 110 may be bonded to a second support 161, and the first support 160 may be separated from the first wiring part 110. Specifically, after the second support 161 is disposed on the upper portion of the first wiring part 110, in relation to FIG. 5, the first support 160 on the lower portion of the first wiring part 110 may be separated, which is illustrated in FIG. 6. Another support 161 is bonded to the first wiring part 110 so as to implement the conductive patterns 112, exposed on the first wiring part 110, in a form of embedded patterns P, and to dispose the electronic component on the embedded patterns P.

Figure 7:
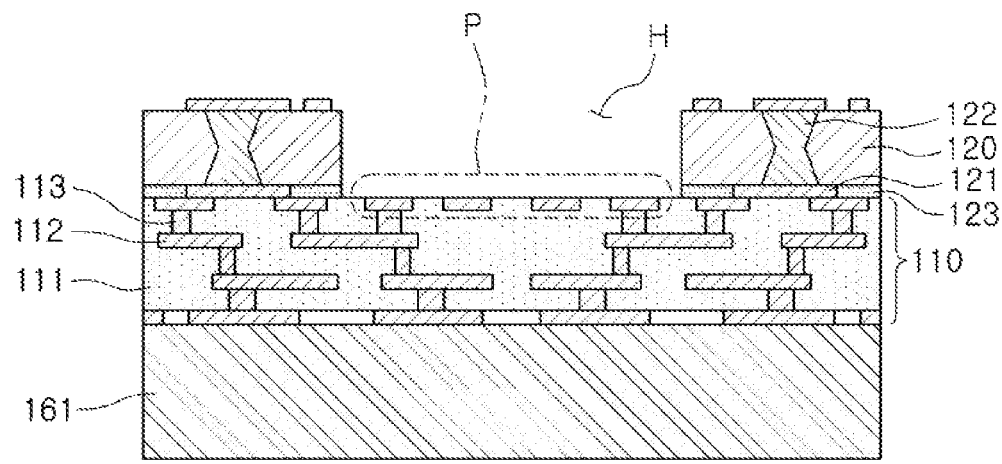

Next, as illustrated in FIG. 7, the frame 120 and the first wiring part 110, described in relation to FIG. 4, may be connected to each other. Specifically, the frame 120 may be disposed on the first wiring part 110, and the frame 120 and the first wiring part 110 may be bonded to each other. In this case, a position of the frame 120 may be adjusted so that the through-hole H is disposed in a region corresponding to the embedded patterns P on which the electronic component is to be disposed.

In order to bond the first wiring part 110 and the frame 120 to each other, the adhesive layer 123 formed of a non-conductive material or the like may be interposed between the first wiring part 110 and the frame 120. However, the first wiring part 110 and the frame 120 may be directly bonded to each other without interposing the adhesive layer 123. In addition, although the present exemplary embodiment describes an example in which the frame 120 is bonded to the first wiring part 110 in a state in which the through-hole has been formed in the frame 120, the hole may also be machined in the frame 120 in a state in which the frame 120 is bonded to the first wiring part 110, in some cases.

Figure 8:
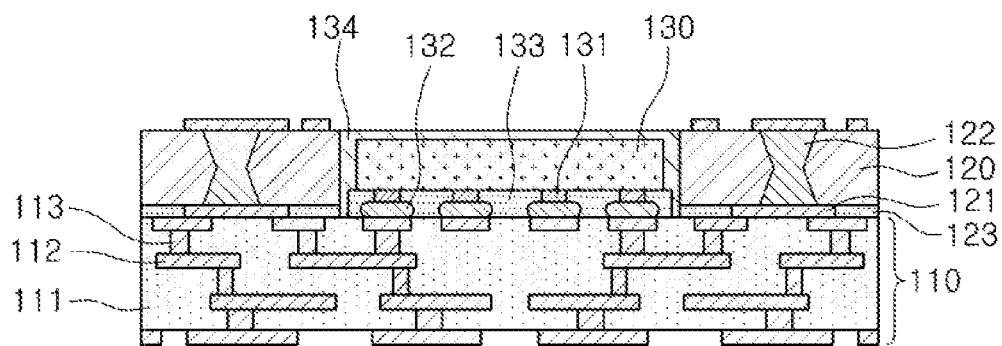

Next, as illustrated in FIG. 8, the electronic component 130 may be disposed and mounted on the first wiring part 110. In this case, the electronic component 130 may be disposed so that the electrode pad 131 is directed toward the first wiring part 110. A detailed description of the adhesive electrical connection part 132 and the adhesive part 133 which may be provided for mounting the electronic component will be omitted. After the electronic component 130 is mounted, the encapsulant 134 may be formed to be filled in the through-hole. As an example of forming the encapsulant 134, a method of stacking a resin film of an uncured state on the first wiring part 110 and then curing the stacked resin film, or an EMC molding method, may be used.

The second support 161 may be removed in a state in which the frame 120 is attached to the first wiring part 110. Additionally, an etching process and a desmearing process used in the art may be appropriately utilized. However, the first support 161 does not need to be removed in the present operation, and may also be removed in a subsequent process or prior to the present operation.

Next, the electronic component package 100 illustrated in FIG. 3 may be obtained by forming the second wiring part 140 on the frame 120. The second wiring part 140 may include one or more insulating layers 141, with the conductive patterns 142 formed on the insulating layers 141 and the conductive via 143 penetrating through the insulating layers 141, and may be obtained by the same method as the first wiring part 110 described above.

Although not illustrated, an additional electronic component or package may be disposed on the second wiring part 140 in order to improve performance of the package 100 or expand an additional function. A so-called package on package (POP) structure may be obtained by disposing the additional electronic component described above.

Hereinafter, a structure of an electronic component and a manufacturing method of the same, according to another exemplary embodiment in the present disclosure, will be described with reference to FIGS. 9 through 12. The present exemplary embodiment is different from or illustrates in more detail the exemplary embodiments described above in a method of forming a through-hole and a conductive connection part in the frame, and may also be applied to the exemplary embodiments described above unless otherwise described. More specifically, in the exemplary embodiment described above, the frame may be implemented by machining the CCL. In the present exemplary embodiment, the frame may be formed using a typical substrate process of stacking a plurality of insulating layers, for example, prepregs.

Figure 9:
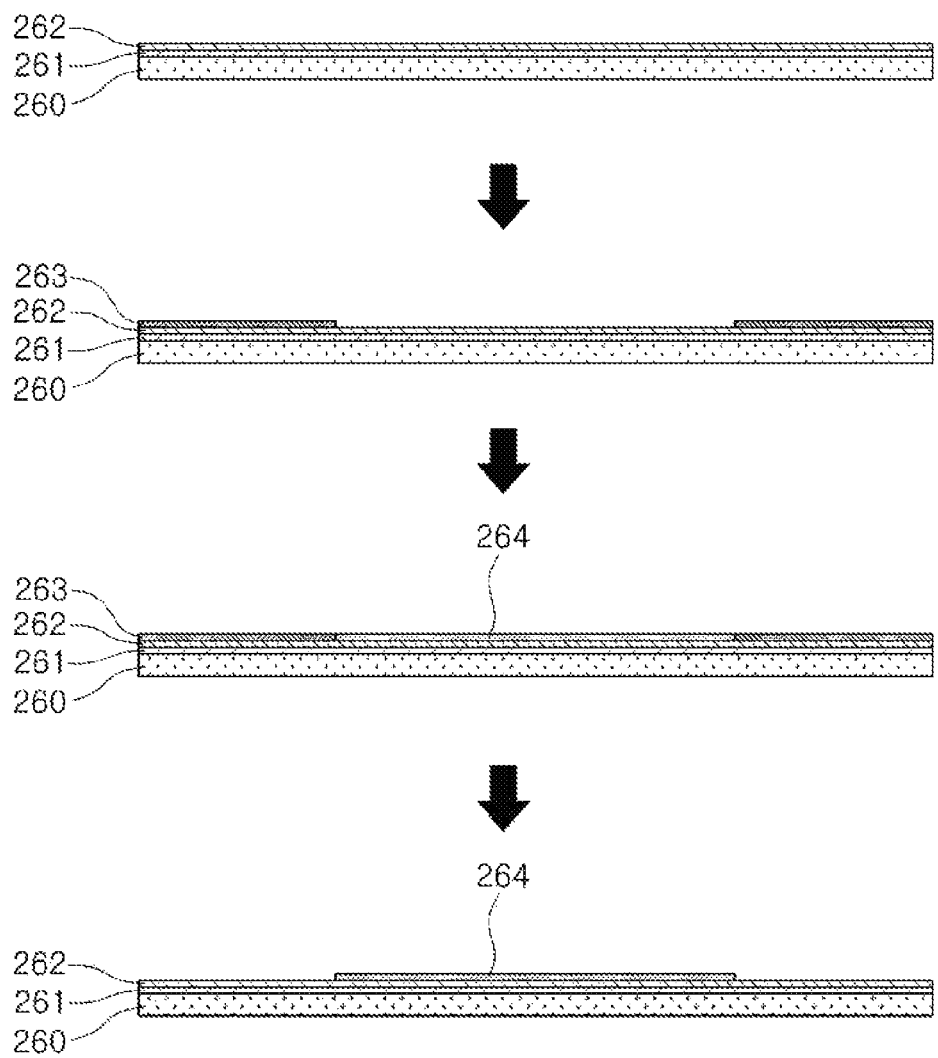
FIGS. 9 through 12 schematically illustrate an electronic component package and a manufacturing method of the same according to another exemplary embodiment in the present disclosure.

First, as illustrated in FIG. 9, an etch stop layer 264 may be formed on a first support 260. According to the present exemplary embodiment, the first support 260 may include a release layer 261 and a metal thin film 262 formed on a surface thereof. However, the release layer 261 and the metal thin film 262 included in the first support 260 may also be excluded. The etch stop layer 264 may be formed by plating nickel (Ni) or the like. To this end, a mask 263 having an appropriate shape may be used. In this case, in order to easily remove the etch stop layer 264 in the subsequent process, the release layer may be interposed between the first support 260 and the etch stop layer 264.

As described below, the purpose of the etch stop layer 264 is to significantly reduce damage to the conductive patterns in the process of forming the through-hole in the frame. A shape of the etch stop layer 264 may be determined by considering a region on which the electronic component is mounted. Depending on the exemplary embodiments, the etch stop layer 264 may be retained in a region around the through-hole in the package, and since the etch stop layer 264 may not be provided, to allow for an electrical connection, the etch stop layer 264 may be electrically isolated from the electronic component.

Figure 10:
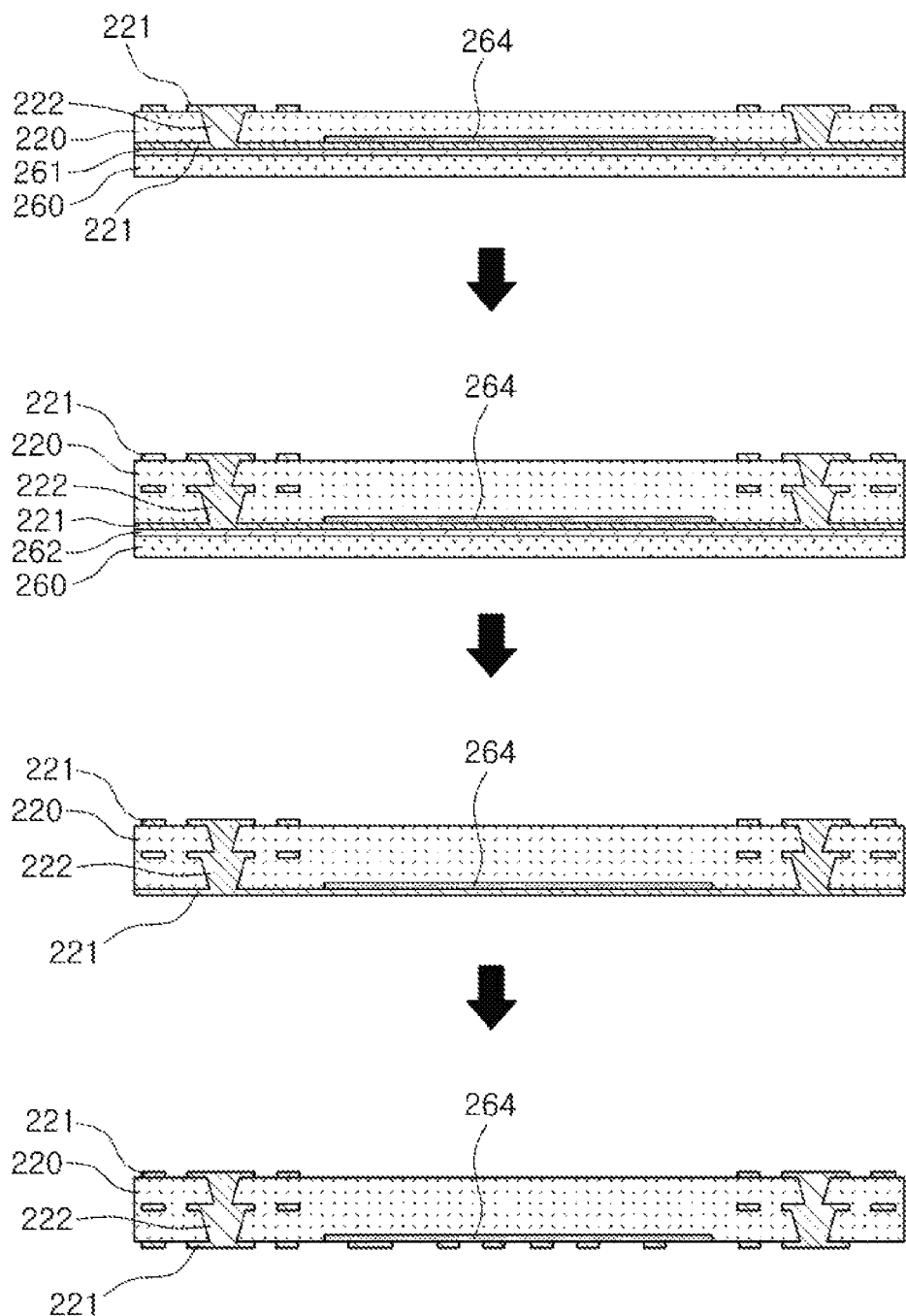

Next, as illustrated in FIG. 10, a frame 220, along with conductive patterns 221 and conductive connection parts 222 included in the frame 220, may be formed on the first support 260 which may be previously machined. According to the present exemplary embodiment, the frame 220 may have a multilayer structure, and may be obtained, for example, by stacking a plurality of prepregs. In this case, as illustrated in FIG. 10, the conductive connection parts 222 may be formed to penetrate through the respective layers of the frame 220 having the multilayer structure, and the conductive connection part 222 of each of the layers may have a conical shape, in which a width is decreased from an upper portion of the conductive connection part 222 to a lower portion thereof. This shape of the conductive connection part 222 may be obtained by executing a stacking process, a process of machining a hole, a process of filling a conductive material, and the like, for each of the layers, unlike in the exemplary embodiments described above.

Furthermore, as illustrated in a lower portion of FIG. 10, after the frame 220 is formed, the first support 260 may be removed. In addition, the conductive patterns 221 may be formed by patterning a metal thin film 262.

Figure 11:
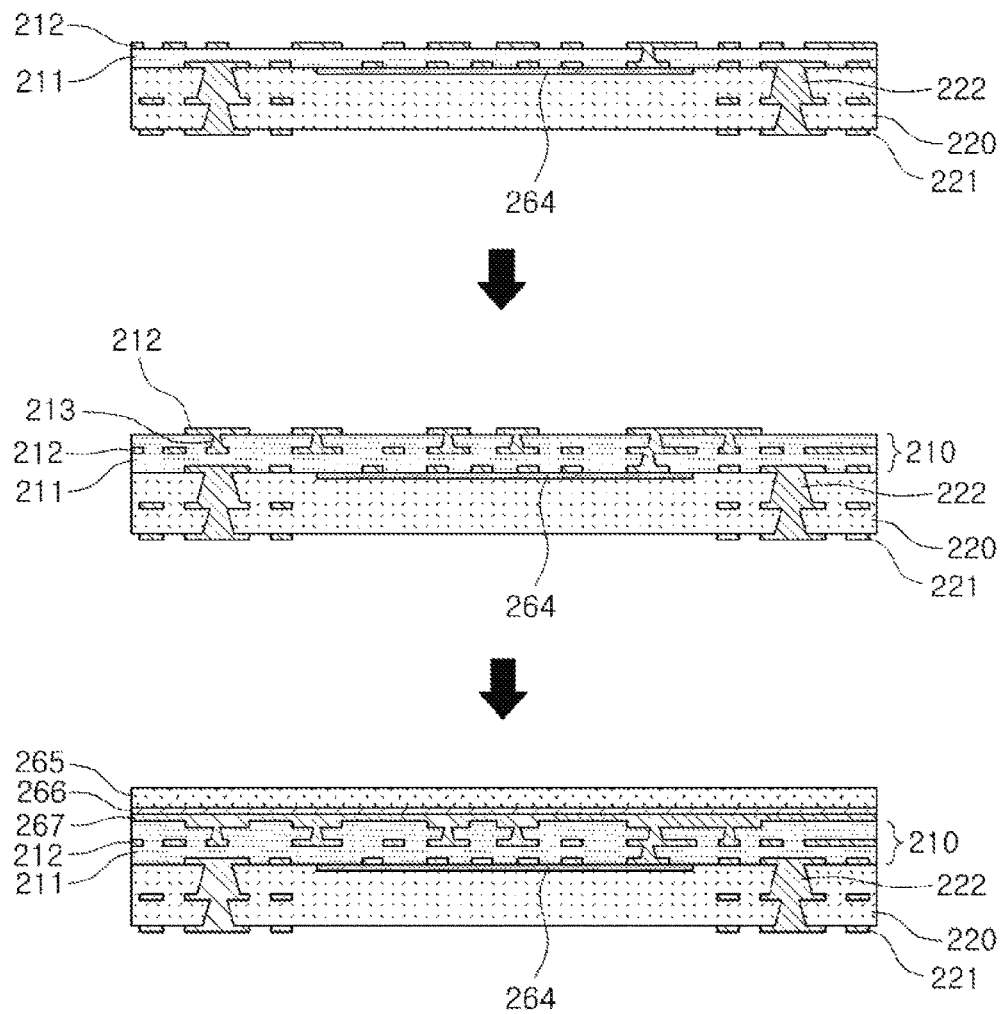

Next, as illustrated in FIG. 11, a first wiring part 210 may be formed on the frame 220. In this case, the first wiring part 210 may be formed on a lower surface of the frame 220 in relation to FIG. 10 and may also be seen in FIG. 11, in which the elements of FIG. 10 are shown in a reversed state. The first wiring part 210 may include a plurality of insulating layers 211, conductive patterns 212, and conductive vias 213. A test jig may be connected to the conductive patterns 212 over the first wiring part 210. Next, a second support 265 may be disposed on the first wiring part 210, and the second support 265 may include a release layer 266 and a metal thin film 267 formed on a surface thereof. A process of forming a through-hole described below may be easily executed by using an additional support 265. However, depending on exemplary embodiments, the subsequent process may be performed without using the second support 265.

Figure 12:
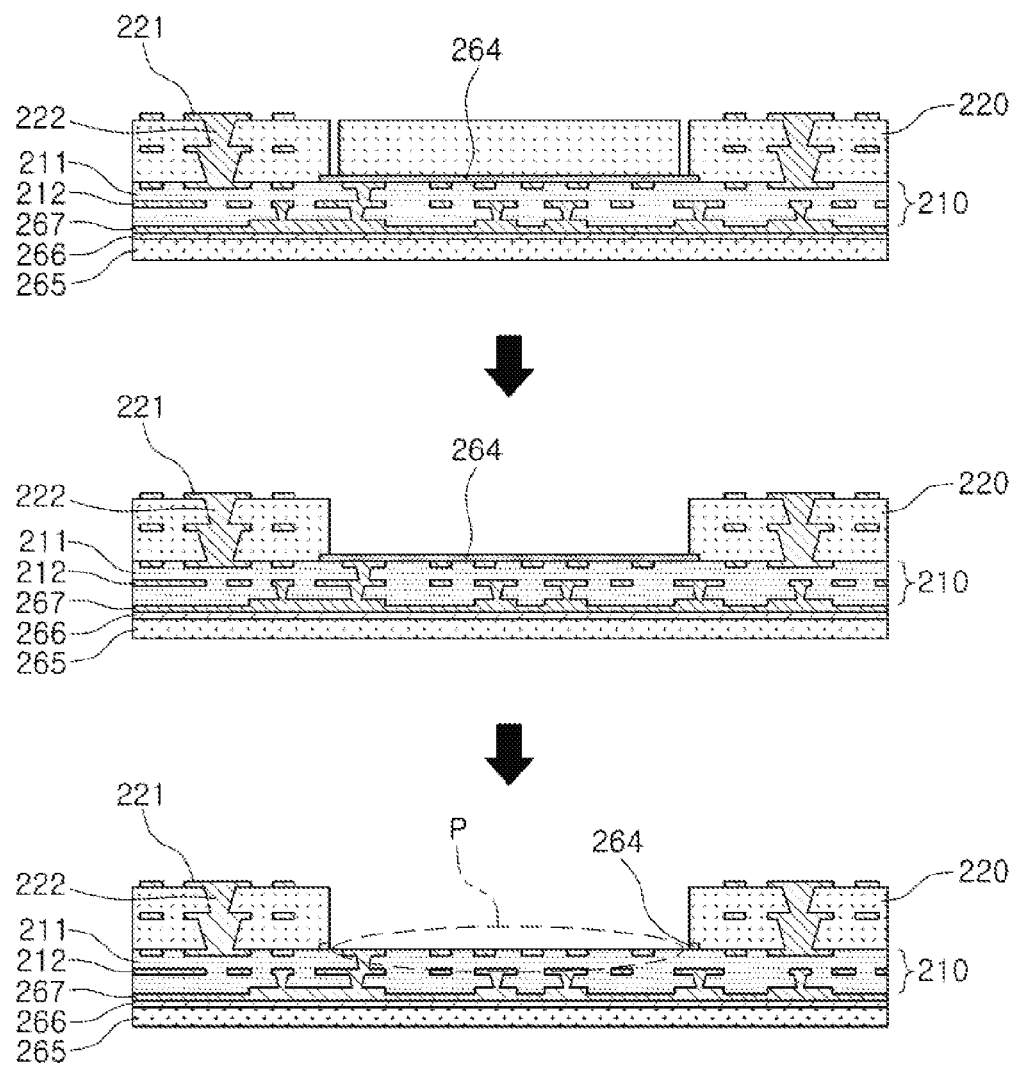

Next, as illustrated in FIG. 12, a through-hole H may be formed in the frame using a laser machining or the like. To this end, the structure which has been previously obtained may be reversed again. After performing the laser machining, the etch stop layer 264 may be removed. As described above, in the case in which the release layer is interposed below the etch stop layer 264, the etch stop layer 264 may be more easily removed. In this case, as described above, when the laser is applied, the existence of the etch stop layer 264 may significantly reduce damage to other components within the package, for example, to the conductive patterns 212, and the like, and may be retained in a region around the through-hole H. In this case, the etch stop layer 264 is not essential to the present exemplary embodiment, and may be electrically isolated from the electronic component.

The conductive patterns P of the first wiring part 210, exposed by removing the etch stop layer 264, may be embedded in the insulating layer 211. As described above, the embedded patterns P may increase mounting density of the electronic component and may aid in implementing the slimness of the package.

After a region on which the electronic component is to be disposed is prepared by forming the through-hole H, the electronic component package may be implemented using the same processes as the exemplary embodiment described above. Specifically, the electronic component may be disposed in the through-hole H, and may be electrically connected to the embedded patterns P. However, the electronic component is not necessarily connected to the embedded patterns P, but may also be connected to other types of conductive patterns. Next, the electronic component package may be obtained by forming a molding part, a second wiring part, and the like. In addition, before completing the package, the second support 265 may be removed. In this case, the metal thin film 267 may be patterned.

Figure 13:
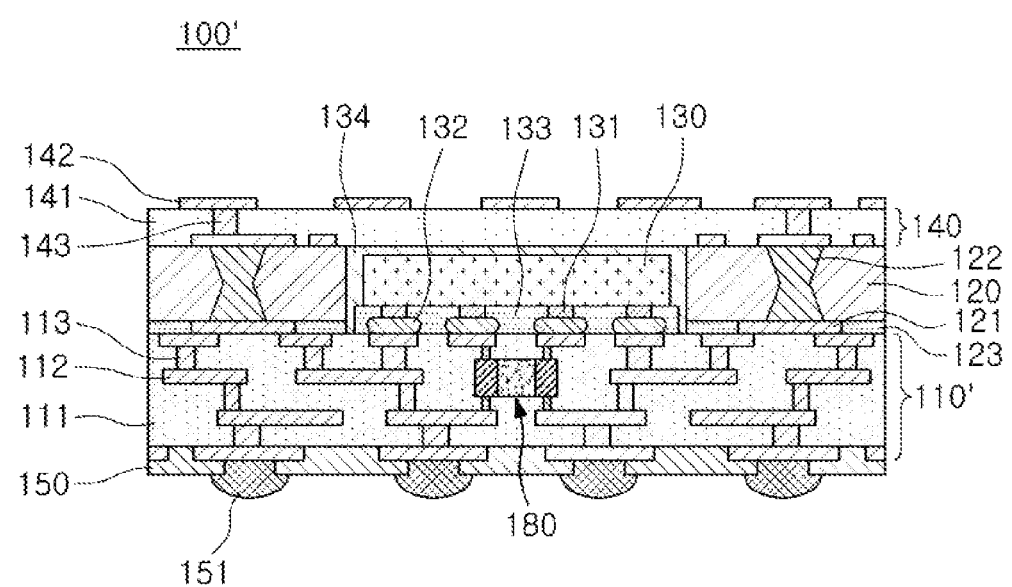
FIG. 13 is a cross-sectional view schematically illustrating another exemplary embodiment of the electronic component package.

FIG. 13 is a cross-sectional view schematically illustrating another example of the electronic component package. An electronic component package 100', according to the present exemplary embodiment, may further include an additional electronic component 180, unlike the exemplary embodiment described above. As illustrated in FIG. 13, the electronic component 180 may be embedded in a first wiring part 110'. The additional electronic component 180 may correspond to a passive element having a relative small size, for example, a capacitor, or the like, which is not essential to the present exemplary embodiment. An element mounting area may be reduced by disposing the passive element in the first wiring part 110', thereby reducing a total size of the package. In addition, since a current path is shortened by disposing the capacitor or the like in a lower portion of the package, electrical characteristics of the package may be improved. In the case in which the passive element is disposed in the lower portion of the package, an active element may be disposed in an upper portion of the package. As a method of burying an electronic component 180 in the first wiring part 110', a method of disposing the electronic component 180, while stacking an insulating layer 111 and covering the electronic component 180 with the insulating layer 111, may be used. Further, in addition to this, a core accommodating the electronic component 180 may be adopted, and a structure in which the electronic component 180 is embedded may be implemented by stacking the insulating layers 111 on upper and lower portions of the core.

As set forth above, according to the exemplary embodiments in the present disclosure, the electronic component package according to an exemplary embodiment may be used, whereby a size of the package may be reduced, and manufacturing efficiency may be achieved, even in the case in which the plurality of electronic components are used. In addition, the electrical test may be performed before mounting the electronic components, whereby the manufacturing efficiency may also be significantly improved. Finally, the manufacturing method of the electronic component package according to an exemplary embodiment is used, whereby the electronic component package described above may be, again, more efficiently manufactured.

While exemplary embodiments have been shown and described above, it will be apparent to those skilled in the art that modifications and variations could be made without departing from the scope of the present invention, as defined by the appended claims.

What is claimed is:

1. An electronic component package comprising:
   first and second wiring parts each including an insulating layer, conductive patterns formed in the insulating layer, and a conductive via penetrating through the insulating layer, to be connected to the conductive patterns;
   a frame disposed between the first and second wiring parts and having one or more through-holes and conductive connection parts electrically connecting the first wiring part with the second wiring part; and an electronic component disposed in the through-hole, and connected to the first wiring part,
wherein the first wiring part includes conductive patterns adjacent to the electronic component among the conductive patterns of the first wiring part, and the conductive patterns adjacent to the electronic component are embedded in the insulating layer of the first wiring part, and
the conductive patterns of the first wiring part adjacent to the electronic component have a smaller pitch than those which are not adjacent to the electronic component.

2. The electronic component package of claim 1, further comprising an encapsulant disposed in the through-hole.

3. The electronic component package of claim 1, wherein the electronic component is disposed such that an electrode pad included in the electronic component is directed toward the first wiring part.

4. The electronic component package of claim 1, wherein the frame is formed of a prepreg, and
the first and second wiring parts include a photo curable material.

5. The electronic component package of claim 1, wherein the first wiring part is thicker than the second wiring part.

6. An electronic component package comprising:
first and second wiring parts each including an insulating layer, conductive patterns formed in the insulating layer, and a conductive via penetrating through the insulating layer, to be connected to the conductive patterns;
a frame disposed between the first and second wiring parts and having one or more through-holes and conductive connection parts electrically connecting the first wiring part with the second wiring part;
an electronic component disposed in the through-hole, and connected to the first wiring part, and
an adhesive layer interposed between the first wiring part and the frame,
wherein the first wiring part includes conductive patterns adjacent to the electronic component among the conductive patterns of the first wiring part, and the conductive patterns adjacent to the electronic component are embedded in the insulating layer of the first wiring part.

7. The electronic component package of claim 6, wherein the adhesive layer is a prepreg or a solder resist.

8. The electronic component package of claim 6, wherein the conductive connection part penetrates through the frame, and has a shape in which a width is decreased from upper and lower surfaces of the frame to an inside of the frame.

9. An electronic component package comprising:
first and second wiring parts each including an insulating layer, conductive patterns formed in the insulating layer, and a conductive via penetrating through the insulating layer, to be connected to the conductive patterns;
a frame disposed between the first and second wiring parts and having one or more through-holes and conductive connection parts electrically connecting the first wiring part with the second wiring part;
an electronic component disposed in the through-hole, and connected to the first wiring part; and
an etch stop layer formed between the first wiring part and the frame, and in a region around the through-hole,
wherein the etch stop layer is made of a metal.

10. The electronic component package of claim 9, wherein the etch stop layer is electrically isolated from the electronic component.

11. The electronic component package of claim 9, wherein the frame has a multilayer structure.

12. The electronic component package of claim 11, wherein the conductive connection part penetrates through each of the layers of the frame having the multilayer structure, and
the conductive connection part of each of the layers has a shape in which a width is decreased from an upper portion of the conductive connection part to a lower portion thereof.

13. The electronic component package of claim 1, further comprising an additional electronic component embedded in the first wiring part.

14. The electronic component package of claim 13, wherein the electronic component is an active element, and the additional electronic component is a passive element.

15. An electronic component package comprising:
first and second wiring parts each including an insulating layer, conductive patterns formed in the insulating layer, and a conductive via penetrating through the insulating layer, to be connected to the conductive patterns;
a frame disposed between the first and second wiring parts and having one or more through-holes and conductive connection parts electrically connecting the first wiring part with the second wiring part;
an electronic component disposed in the through-hole, and connected to the first wiring part; and
an etch stop layer formed between the first wiring part and the frame, and in a region around the through-hole,
wherein the etch stop layer is partially embedded in the frame.

* * * * *